US009646965B2

(12) United States Patent
Wang et al.

(10) Patent No.: US 9,646,965 B2
(45) Date of Patent: May 9, 2017

(54) MONOLITHICALLY INTEGRATED TRANSISTORS FOR A BUCK CONVERTER USING SOURCE DOWN MOSFET

(71) Applicant: TEXAS INSTRUMENTS INCORPORATED, Dallas, TX (US)

(72) Inventors: Jun Wang, Hellertown, PA (US); Frank Baiocchi, Allentown, PA (US); Haian Lin, Bethlehem, PA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/608,391

(22) Filed: Jan. 29, 2015

(65) Prior Publication Data
US 2015/0214222 A1 Jul. 30, 2015

Related U.S. Application Data

(60) Provisional application No. 61/933,717, filed on Jan. 30, 2014.

(51) Int. Cl.
H01L 27/088 (2006.01)
H01L 29/78 (2006.01)
H02M 3/155 (2006.01)
H02M 3/158 (2006.01)

(52) U.S. Cl.
CPC ........ *H01L 27/088* (2013.01); *H01L 29/7816* (2013.01); *H02M 3/1588* (2013.01); *Y02B 70/1466* (2013.01)

(58) Field of Classification Search
CPC .................................................... H01L 27/088
See application file for complete search history.

(56) References Cited

U.S. PATENT DOCUMENTS

| 7,074,659 | B2 | 7/2006 | Zuniga et al. |
| 7,235,845 | B2* | 6/2007 | Xu .................... H01L 29/402 257/336 |
| 7,566,931 | B2 | 7/2009 | Kocon |
| 8,546,221 | B2 | 10/2013 | Girdhar et al. |
| 9,076,778 | B2* | 7/2015 | Hebert .................... H01L 24/34 |
| 2010/0155836 | A1* | 6/2010 | Hebert ............ H01L 21/823487 257/334 |
| 2011/0163732 | A1 | 7/2011 | Sapp et al. |
| 2012/0098038 | A1 | 4/2012 | Shono |
| 2012/0171817 | A1 | 7/2012 | Hebert |
| 2012/0193709 | A1* | 8/2012 | Sukegawa ....... H01L 21/823807 257/337 |

(Continued)

OTHER PUBLICATIONS

PCT/US15/13989 Search Report, mailed Apr. 29, 2015.

*Primary Examiner* — Su C Kim
*Assistant Examiner* — David S Wilbert
(74) *Attorney, Agent, or Firm* — William B. Kempler; Charles A. Brill; Frank D. Cimino

(57) ABSTRACT

An integrated semiconductor transistor chip for use in a buck converter includes a high side transistor formed on the chip and comprising a laterally diffused metal oxide semiconductor (LDMOS) transistor and a low side transistor formed on the chip and comprising a source down metal oxide semiconductor field effect transistor (MOSFET). The chip also includes a substrate of the chip for use as a source for the low side transistor and an n-doped well for isolation of the high side transistor from the source of the low side transistor.

9 Claims, 4 Drawing Sheets

(56) References Cited

U.S. PATENT DOCUMENTS

2013/0270636 A1* 10/2013 Ito .................. H01L 29/7835
257/336
2014/0035032 A1* 2/2014 Korec ................ H01L 21/8234
257/337

* cited by examiner

MONOLITHICALLY INTEGRATED TRANSISTORS FOR A BUCK CONVERTER USING SOURCE DOWN MOSFET

CROSS-REFERENCE TO RELATED APPLICATIONS

The present application claims priority to U.S. Provisional Patent Application No. 61/933,717, filed Jan. 30, 2014, titled "Monolithically Integrated Buck Converter Using Source Down MOSFET," which is hereby incorporated herein by reference in its entirety.

BACKGROUND

Synchronous buck voltage converters are widely used in power supplies for portable computers, servers, telecommunication devices, computing applications, and various other portable systems. Unfortunately, many buck converters are fairly large so that they can handle high current levels at high switching frequencies and may do so with lower switching efficiency.

SUMMARY

An integrated semiconductor transistor chip for use in a buck converter includes a high side transistor formed on the chip and comprising a laterally diffused metal oxide semiconductor (LDMOS) transistor and a low side transistor formed on the chip and comprising a source down metal oxide semiconductor field effect transistor (MOSFET). The chip also includes a substrate of the chip for use as a source for the low side transistor and an n-doped well for isolation of the high side transistor from the source of the low side transistor.

BRIEF DESCRIPTION OF THE DRAWINGS

For a detailed description of exemplary embodiments of the invention, reference will now be made to the accompanying drawings in which.

DETAILED DESCRIPTION

Certain terms are used throughout the following description and claims to refer to particular system components. As one skilled in the art will appreciate, various companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections.

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Existing synchronous buck converters with high current handling capability use discrete power metal oxide semiconductor field effect transistors (MOSFETs). One transistor is called the low side transistor and another transistor is called the high side transistor. Such discrete solutions may introduce large parasitic inductance and resistance which results in lower conversion efficiency. Some converters use package integrated MOSFETs, but such solutions may have higher package costs. Other solutions use monolithically-integrated transistors for the buck converter but use laterally-diffused metal oxide semiconductor (LDMOS) transistors as both low side and high side transistors. Because of lateral current flow and limitations of metal spreading resistance, it may be difficult for such solutions to achieve satisfactorily high current handling capability with an acceptably high conversion efficiency. The embodiments described herein address these problems.

Figure 1:
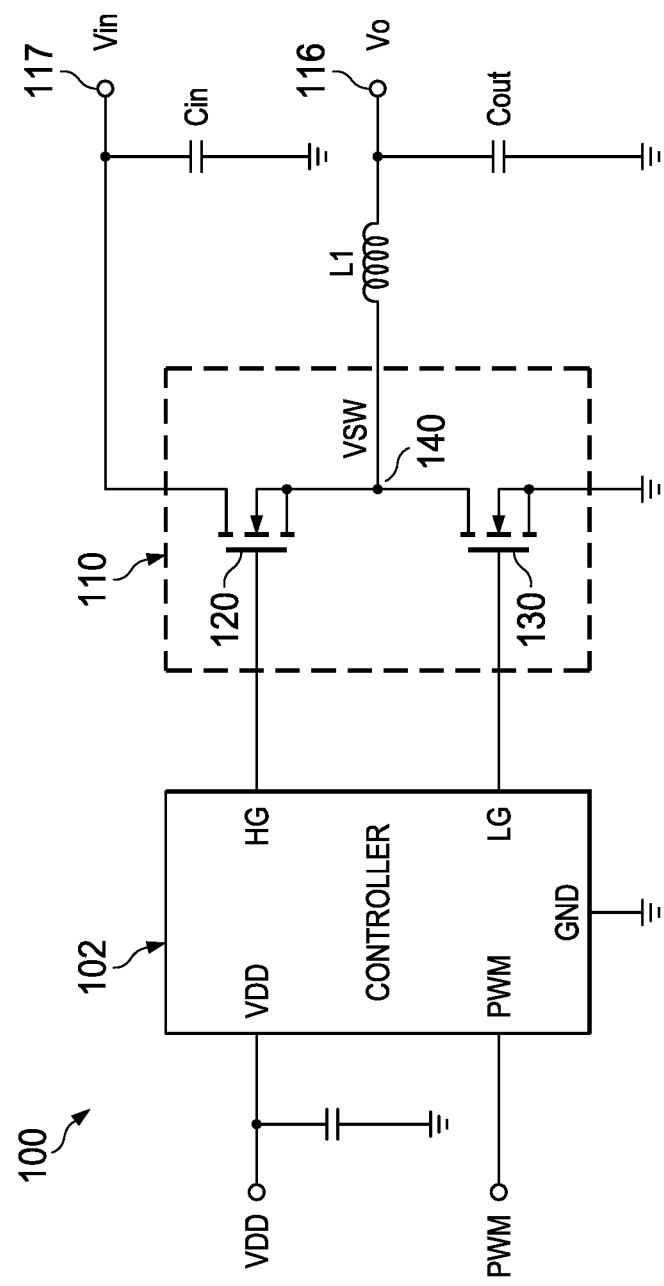
FIG. 1 illustrates a buck converter including a pair of monolithically formed transistors in accordance with various implementations.

FIG. 1 illustrates an example of a buck converter 100 in accordance with various implementations described herein. As shown, the converter 100 includes a controller 102, a pair of transistors 110, an inductor L1, and an output capacitor Gout. Additional components are possible as well. For example, an input capacitor Cin is shown as well as a capacitor on the VDD input to the controller 102. An input voltage Vin is provided to the Vin input terminal and a pulse width modulated signal is provided to the PWM input of the controller. The PWM input signal is used by the controller 102 to control the voltage level of the output voltage Vo. By adjusting the PWM input signal, different output voltage levels are made possible based on the input voltage Vin. That is, the Vin input voltage is converted to a different (typically lower) output voltage Vo.

The transistors 100 include a transistor pair 110 including a "high side" transistor 120 (sometimes referred to as a "control FET") and a "low side" transistor 130 (sometimes referred to as a "sync FET"). The transistors 120, 130 function as switches and are turned on and off under control by the controller 102. The controller asserts a high side gate control output signal (HG) which controls the gate of the high side transistor 120, and a low side gate control output signal (LG) which controls the gate of the low side transistor 130. The controller reciprocally turns each of the high and low side transistors 120, 130 on and off in accordance with the level of the PWM input signal. The two transistors 120, 130 are generally not both on at the same time—that is, while one is on, the other is off and vice versa, although both transistors may be off at the same time. The duty cycle of the transistors dictates the output voltage level of the output voltage Vo.

Figure 2:
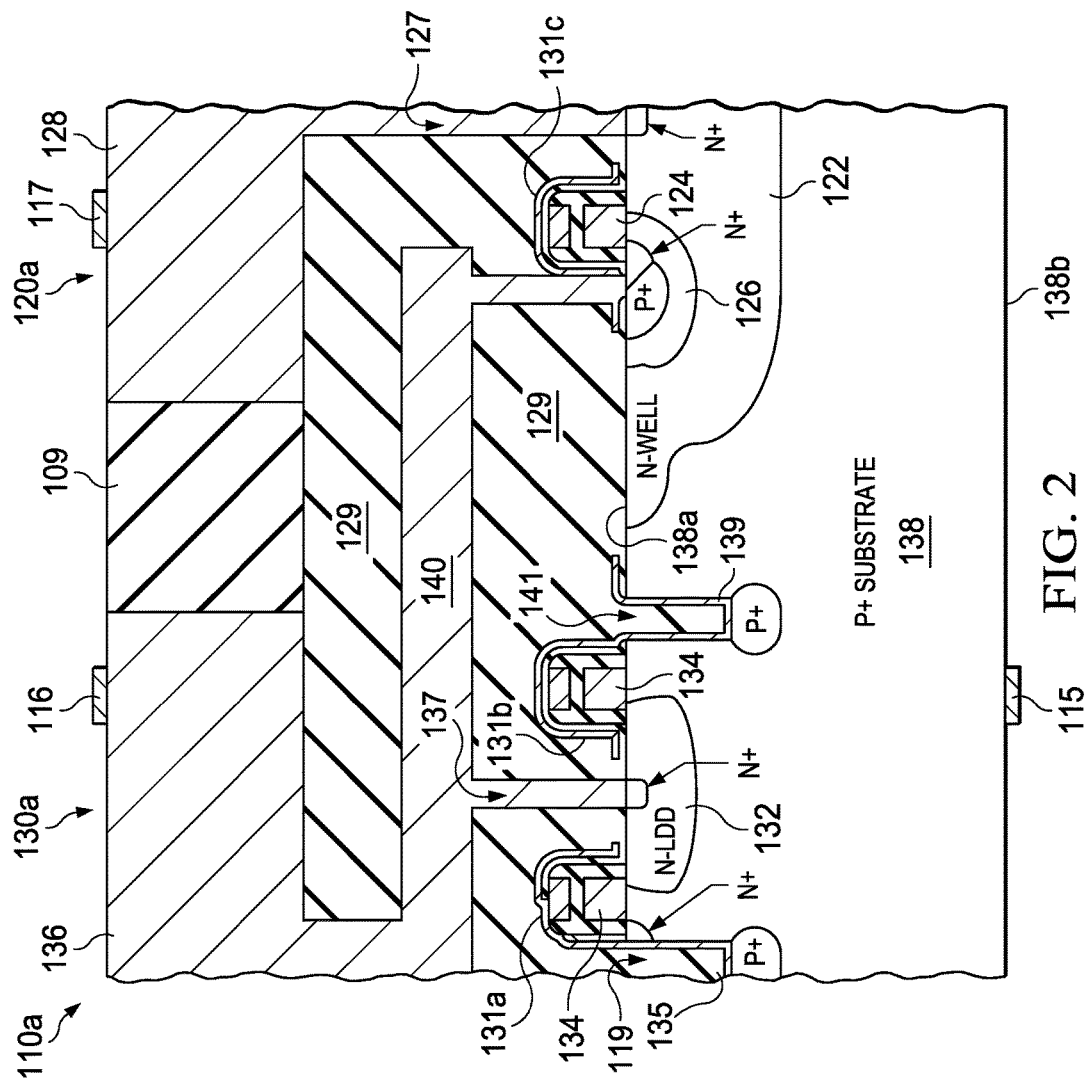
FIG. 2 shows an example of an implementation of the monolithically formed transistors of FIG. 1.

In accordance with various examples provided herein, the transistor pair 110 comprising high side transistor 120 and low side transistor 130 is formed on a single semiconductor substrate. That is, the transistors 120, 130 are monolithically integrated on a single semiconductor chip. FIG. 2 shows an example of a monolithically integrated transistor pair 110a for use in buck converter 100. The low side transistor 130a is shown on the left side of the semiconductor structure and the high side transistor 120a is shown on the right side of the semiconductor structure. An edge region 109 (e.g., a dielectric) separates the two transistors 120a, 130a. The low side transistor 130a may be implemented as a source down MOSFET. The high side transistor 120a may be implemented as an LDMOS transistor.

The low side transistor 130a in this example includes an n-doped drain that includes a lightly doped drain region (N-LDD) 132 that is long enough to maintain the required breakdown voltage, a source formed by the substrate 138, and a gate 134. An electrical connection to the N-LDD 132 is provided through a second metal structure 136 which is provided down by a second via 137 to the N-LDD 132. The source is provided by a P+ doped substrate 138, whose doping concentration generally increases from top surface 138a towards opposing bottom surface 138b. The gate 134 and N-LDD 132 are provided on one side of the silicon substrate 138, while the source connection 115 is on the back side of the silicon on the substrate 138.

The high side transistor 120a includes a drain formed in the n-doped well region (N-well) 122, a source formed in a p-doped (P+) region 126, and a high side gate 124. An electrical connection to the N-well 122 (drain) is provided by a first metal structure 128 which is provided down a via 127 to the N-well/drain. Thus, the source of the high side transistor 120a is formed as part of the P+ region 126, and the drain is formed in the N-well 122. The drain in N-LDD 132 of the low side transistor 130a is electrically connected to the source in P+ region 126 of the high side transistor 120 through a metal which forms a switch node VSW 140. Region 129 is a dielectric material. The N-well 122 (drain) of the high side transistor 120a forms the input node Vin of the buck converter (see also FIG. 1) to which a connection can be made at electrical contact 117. The output node Vo of the buck converter is provided via contact 116 by the VSW node 140 through the inductor L1 (as shown in FIG. 1).

The low side transistor 130a in the example of FIG. 2 (as well as in FIGS. 3 and 4 as transistors 130b, 130c) is a source down MOSFET which means that current generally flows vertically down the structure from the N-LDD 132 (drain) through the gate-controlled channel and down through the substrate 138 (source) and out the back side of the structure (i.e., the opposite side of the substrate 138 from the N-LDD 132). The high side transistor 120a in this integrated transistor pair 110a is an LDMOS transistor in which current flows from the Vin node down through a first via 127 to the drain in N-well 122, across a channel not specifically shown) formed in the device to the P+ region 126 (source), and across the metal VSW node 140 to the drain of N-LDD region 132 of the low side transistor 130.

Isolation between the high side transistor 120a and the low side transistor 130a is provided, at least in part, by the N-well 122, which is formed between the substrate 138 and the source of the high side transistor. The N-well 122 and the P+ region 126 form a P-N junction which is reversed bias due to application of the input voltage Vin to the n-doped well (N-well 122). As a reversed biased P-N junction, current is not permitted to flow through the N-well 122 from the P+ region 126 of the high side transistor 120 to the substrate 138 which also is the source of the low side transistor 130. Thus, the sources of the two transistors 120, 130 are isolated from each other.

The example of FIG. 2 also includes field plates 131a, 131b, and 131c formed over the various gates 134 and 124. The field plates 131a-c are metal and are connected to the grounded substrate 138. The field plates 131a-c provide electrical shielding for the transistor gates. Field plate 131a is connected to the substrate at point 135 which is provided in a first trench 119. Field plate 131b is connected to the substrate 138 in a second trench 141 formed in the substrate in the edge region between the transistors. The metal of the field plates 131a-b is well-grounded through sufficient contact area with the grounded substrate 138. The depth 139 of the second trench 141 provides a contact point to higher doped areas of the substrate for improved grounding performance. The high side gate 124 also is shielded by way of field plate 131c which is part of the metal VSW node 140.

Figure 3:
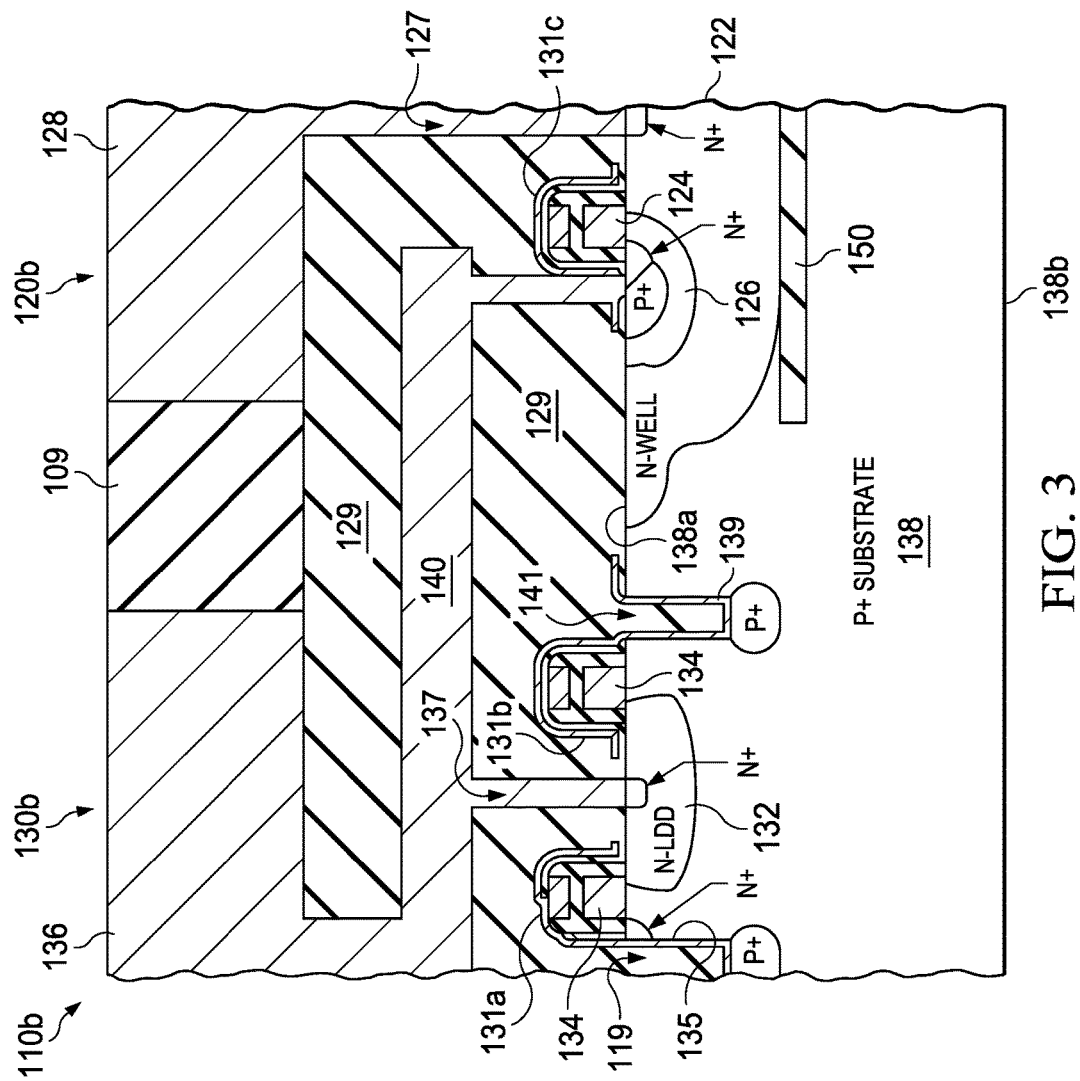
FIG. 3 shows another example of an implementation of the monolithically formed transistors of FIG. 1 including an additional insulating layer.

FIG. 3 provides a monolithically integrated transistor pair 110b comprising transistors 120b, 130b, similar to that of FIG. 2. A difference between the structure of FIGS. 2 and 3 is that the structure of FIG. 3 includes an insulating layer 150. In various implementations, the insulating layer 150 is provided between the N-well 122 (drain) of the high side transistor 120b and at least portions of the substrate 138. The insulating layer 150 may be formed by, for example, oxygen implantation or other insulating doping. The insulating layer 150 provides additional decoupling of the high side N-well 122 from the P+ substrate 138, and functions to further disable the parasitic p/n/p bipolar transistor that otherwise might be formed by the high side P+ region 126, N-well 122, and substrate 138.

Figure 4:
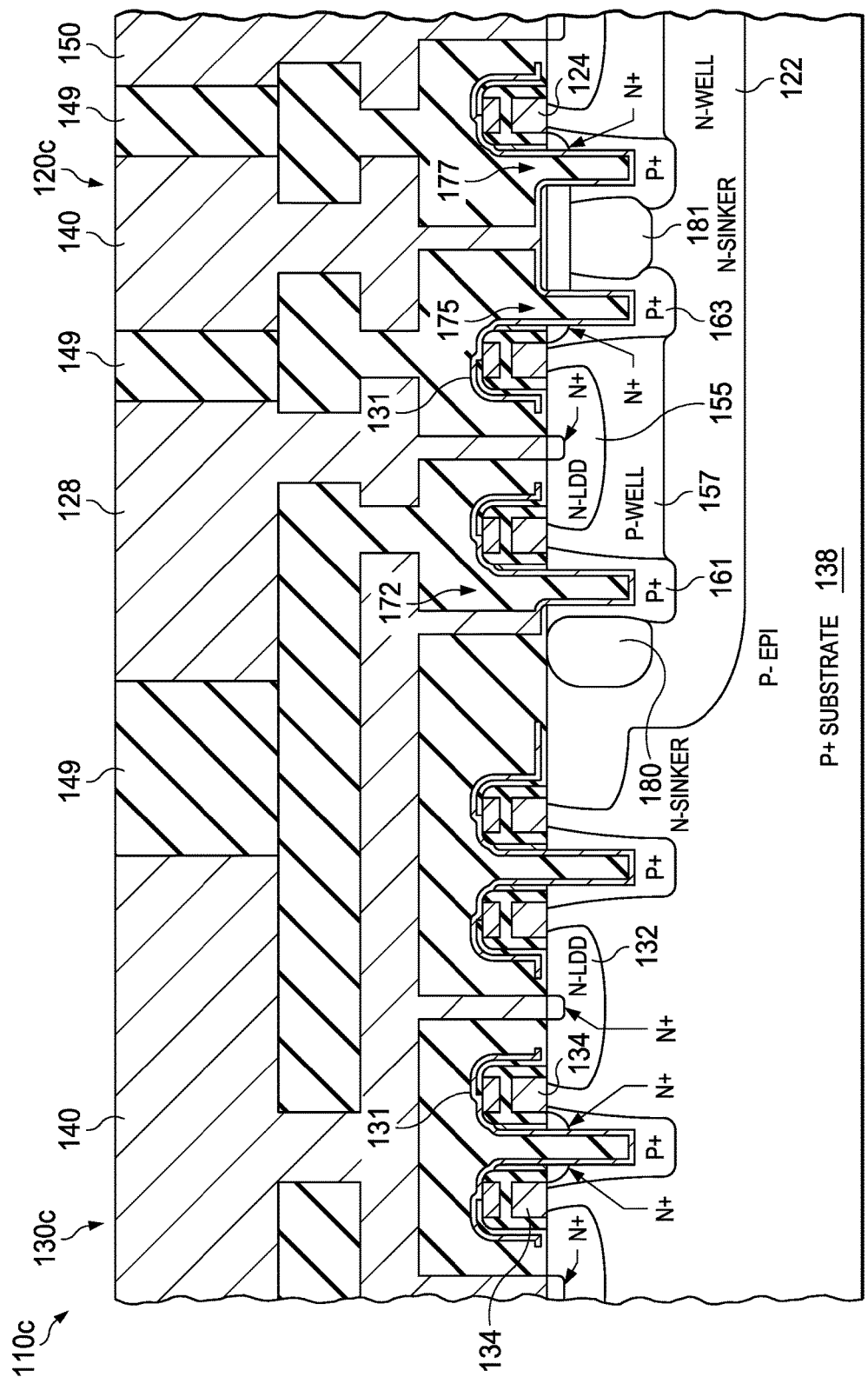
FIG. 4 shows yet another example of implementation of the monolithically formed transistors of FIG. 1.

FIG. 4 illustrates yet another implementation of a monolithically formed transistor pair 110c for buck converter 100. In the example of FIG. 4, the low side transistor 130c is generally the same as in the implementations of FIGS. 2 and 3, although additional gates (LG) are shown. As is well known in the art, transistors 120 and 130 of formed from a plurality of "fingers". As shown in FIG. 4 transistor 130 has four fingers and transistor 120 has three fingers. The high side transistor 120c, however, is different than in the previous embodiments. In FIG. 4, the N-LDD region 155 represents the drain of the high side transistor and the P-well 157 represents the source of the high side transistor. The P-well region is a p-doped region and is generally at the same voltage potential as the neighboring first and second P+ regions 161 and 163. The P+ regions 161 and 163 have a higher doping concentration than the P-well 157. The voltage switch node (VSW) 140 connects the N-LDD region 132 (drain of the low side transistor 130c) to the source of the high side transistor 120c. More specifically, the metal of the VSW node 140 is provided down a trench 172 to thereby contact the P+ region 161. The P+ region 163 is also contacted by metal from VSW node 140 in trench 175. Although FIG. 4 seems to show two different instances of the VSW node 140, the two VSW node 140 instances are connected together, partially through the metal in the third, fourth and fifth trenches 172, 175, and 177, respectively and through the P+ regions 161, 163 and the P-well, but also by separate metal connections in the structure that are not shown in the FIG. 4. Similarly, the two instances of the Vin node 128 shown in FIG. 4 are electrically connected together by metal (not shown) in FIG. 4. Regions 149 in FIG. 4 represent dielectric material to electrically isolate the Vin node 128 from the Vout nodes 140.

The structure of FIG. 4 includes a P-well 157 within the N-well 122 for improved isolation between high and low side transistors 120c and 130c. Individual n-sinkers 180, 181 are included as well with the high side transistor 120c to provide a low resistance path from Vout (VSW node 140) to the N-well 122. The N-sinkers are heavily n-doped regions and help to ensure the N-well potential is at the Vout (VSW) potential with minimal voltage variation laterally through the structure due to current flow.

Unlike in the structures of FIGS. 2 and 3, the N-well 122 in the structure of FIG. 4 does not represent the drain of the high side transistor. However, like the previous structures, the N-well 122 of FIG. 4 helps to isolate the high side transistor 120 from the low side transistor 130.

As described previously as well, the various gates 134 and 124 in FIG. 4 are shielded with field plates 131 whose metal contacts the P+ regions in the various trenches.

The embodiments described herein generally achieve smaller parasitic inductance and higher conversion efficiency than other solutions may be able to achieve. If a buck converter was constructed by a pair of discrete power transistors, the parasitic source inductances associated with the transistor packaging and printed circuit board (PCB) traces will affect the switching performance of the converter and cost additional power loss. In the disclosed examples above, the drain in the N-LDD 132 of the low side transistor 130 is electrically connected to the source in the P+ region 126 of the high side transistor 120 through a metal directly. The parasitic source inductance of the high side transistor, associated with the transistor packaging and PCB traces that otherwise would be present in discrete transistor implementations is removed from the circuit. Consequently, the additional power loss noted above is avoided.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An integrated semiconductor transistor chip for use in a buck converter, comprising:
    a high side transistor formed on the integrated semiconductor transistor chip and comprising a laterally diffused metal oxide semiconductor (LDMOS) transistor;
    a low side transistor formed on the integrated semiconductor transistor chip and comprising a source down metal oxide semiconductor field effect transistor (MOSFET);
    a substrate of the integrated semiconductor transistor chip for use as a source for the low side transistor; and
    an n-doped well for isolation of the high side transistor from the source of the low side transistor and a p-doped well formed within the n-doped well for further isolation, the n-doped well being kept at a switch node potential; and
    a p-doped well that is formed between the n-doped well and a high side drain LDD region for disrupting a parasitic p-n-p transistor that would otherwise be formed between the substrate (p), n-well (n), and a high side body region (p);
        further comprising a metal layer formed in the integrated semiconductor transistor chip to electrically connect a drain of the low side transistor to the source of the high side transistor.

2. The integrated semiconductor transistor chip of claim 1 further comprising an insulating layer formed in the integrated semiconductor transistor chip between at least portions of the substrate and the n-doped well.

3. The integrated semiconductor transistor chip of claim 2 wherein the insulating layer comprises an oxygen implantation layer.

4. The integrated semiconductor transistor chip of claim 1 further comprising an n-sinker within the region of the integrated semiconductor transistor chip containing the high side transistor to provide a low resistance path from a switch node to the n-well, wherein the switch node includes a metal layer interconnecting a drain of the low side transistor and the source of the high side transistor, to maintain the n-well region at the same potential as the switch node.

5. The integrated semiconductor transistor chip of claim 1 further comprising a plurality of n-sinkers within the region of the integrated semiconductor transistor chip containing the high side transistor to provide low resistance paths from a switch node to the n-well, wherein the switch node includes a metal layer interconnecting a drain of the low side transistor and the source of the high side transistor, to maintain the n-well region at the same potential as the switch node.

6. The integrated semiconductor transistor chip of claim 1 wherein the n-doped well is formed between the substrate and a source of the high side transistor.

7. The integrated semiconductor transistor chip of claim 1 in which the source contact trench of the high side transistor is used to connect the p-well and the n-well together.

8. The integrated semiconductor transistor chip of claim 1 wherein depth and doping density of the p-well prevents the parasitic n (LDD), p (p-well) and n (n-well) from turning on.

9. A buck converter utilizing the integrated semiconductor transistor chip of claim 1.

* * * * *